US006677690B2

(12) United States Patent
Fosnight et al.

(10) Patent No.: US 6,677,690 B2
(45) Date of Patent: Jan. 13, 2004

(54) SYSTEM FOR SAFEGUARDING INTEGRATED INTRABAY POD DELIVERY AND STORAGE SYSTEM

(75) Inventors: William J. Fosnight, Austin, TX (US); Daniel Babbs, Austin, TX (US); Richard Gould, Fremont, CA (US); Michael Krolak, Los Gatos, CA (US); David Feindel, Pleasanton, CA (US); Timothy Luong, San Jose, CA (US)

(73) Assignee: Asyst Technologies, Inc., Fremont, CA (US)

( * ) Notice: Subject to any disclaimer, the term of this patent is extended or adjusted under 35 U.S.C. 154(b) by 497 days.

(21) Appl. No.: 09/776,227

(22) Filed: Feb. 2, 2001

(65) Prior Publication Data

US 2002/0105236 A1 Aug. 8, 2002

(51) Int. Cl.[7] ................................................. H02H 1/00
(52) U.S. Cl. ...................................................... 307/326
(58) Field of Search ............................. 307/326; 361/1; 414/222.01

(56) References Cited

U.S. PATENT DOCUMENTS

| 4,532,970 A | 8/1985 | Tullis et al. .................. 141/98 |
| 4,534,389 A | 8/1985 | Tullis et al. .................. 141/98 |
| 5,980,183 A | 11/1999 | Fosnight et al. ......... 414/222.01 |

OTHER PUBLICATIONS

U.S. patent application Ser. No. 08/891,543, Bonora et al.

Primary Examiner—Gregory J. Toatley, Jr.
(74) Attorney, Agent, or Firm—O'Melveny & Myers LLP

(57) ABSTRACT

A system is disclosed for safeguarding fab operators and workpieces such as semiconductor wafers from harm as a result of collision between an operator and a transport assembly for the workpieces as the workpieces are transported between tools and storage nests within a tool bay.

4 Claims, 13 Drawing Sheets

US 6,677,690 B2

SYSTEM FOR SAFEGUARDING INTEGRATED INTRABAY POD DELIVERY AND STORAGE SYSTEM

CROSS REFERENCE TO RELATED PATENTS AND APPLICATIONS

The present application is related to the following patent and application, which patent and application are assigned to the owner of the present invention and which patent and application are incorporated by reference in their entirety herein:

U.S. Pat. No. 5,980,183, entitled, "Integrated Intrabay Buffer, Delivery and Stocker System," to Fosnight; and U.S. patent application Ser. No. 08/891,543, entitled "SMIF Pod Storage, Delivery And Retrieval System," to Bonora et al.

BACKGROUND OF THE INVENTION

1. Field of the Invention

The present invention relates to the manufacture of semiconductor wafers, and in particular to a system for safeguarding fab operators and workpieces such as semiconductor wafers from harm as the workpieces are transported between tools by a workpiece transport assembly.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles and molecular contaminants become of interest.

A SMIF system includes a minimum volume, sealed pod used for storing and transporting wafers. Within a wafer fab, a first automated transport system is provided for transferring the SMIF pods from one processing tool bay to another (interbay delivery systems), and a second automated transport system is provided for transferring the pods around within each particular bay (intrabay delivery systems). Each tool bay, typically on the order of about eighty feet long, consists in general of a number of processing tools for performing various wafer fabrication functions, and at least one stocker, where the pods may be stored before or after processing. Additionally, as a pod is generally transferred to several processing tools within a particular bay, the pod may be stored in the stocker between processes. A stocker is typically a large unit having a plurality of shelves on which the pods may be stored, and a transport system for transferring pods into and out of the stocker, and for moving pods around within the stocker.

U.S. Pat. No. 5,980,183 to Fosnight, previously incorporated by reference, discloses an intrabay pod storage and transport system comprising a plurality of pod support surfaces, or nests, distributed throughout the tool bay and mounted to the sides, on the front and/or above the tools within the bay. The intrabay pod storage and transport system further includes a transport assembly comprised of at least one robotic pod gripper mounted on horizontal and vertical rails to enable pod transport in the X-Z plane, i.e., along the length and height of the tool bay, to transport the pods between the various storage nests and load ports for the process tool.

Typically, some processing tools within a tool bay are high throughput tools which are capable of performing their particular wafer process at a relatively higher rate than other processing tools. Additionally, some tools within a bay are metrology tools, which in general monitor or test a single wafer from within a pod of wafers. A pod may store, for example, 25 wafers. If a normal throughput tool can process 50 wafers in an hour, the transport system need only supply 2 pods per hour to that tool. However, for metrology tools which can process 50 wafers in an hour, but only use one wafer per pod, 50 pods must be provided to the metrology tool in an hour to keep the tool from sitting idle.

In order to accommodate high throughput and metrology tools, it is known to include a local tool buffer adjacent the tool port of high throughput and metrology tools, so that pods may be stored locally adjacent such tools and quickly transferred to these tools without having to constantly retrieve a pod from the remotely located stocker. Such local tool buffers are generally configured adjacent the high throughput and metrology tools, and include shelves for storing pods, and a transport system for transferring pods to, from, and within the local tool buffer.

U.S. patent application Ser. No. 08/891,543 to Bonora et al., previously incorporated by reference, discloses a local tool buffer including a plurality of nests proximate to high throughput tools and a local transport assembly comprised of at least one robotic gripper capable of transporting the pods in the X-Z plane to transport the pods between the various storage nests and the high throughput process tool at which the nests are located.

Pod storage and transport systems such as those disclosed in U.S. Pat. No. 5,980,183 and U.S. patent application Ser. No. 08/891,543 provide several advantages with respect for example to flexibility of tool bay design and refit, the ease with which the storage and transport system may be scaled to fit tool bays of different sizes, and improved pod delivery times and throughput. However, the coexistence of pod storage and transport systems in a tool bay with the human fab operators within the tool bay present several concerns which must be addressed.

A first concern is to avoid injury to fab operators as a result of collision with the pod transport assembly or pods carried thereby as the transport assembly transports the pods within the tool bay. Fab operators commonly work within the tool bays to monitor the operation of the tools, manually transport pods to and from tools and perform maintenance on the tools within the bay. Semiconductor Equipment and Handling International (SEMI) Draft Document 2843D requires that all high speed horizontal transport of pods by the transport assembly occur above 2135 mm from the floor. Alternatively, the system could be configured for the OSHA minimum egress height of 7'6". However, the pod transport assembly must be able to lower into the areas occupied by the fab operators (which areas are referred to herein as human/automation common areas) to transfer pods to and from load ports, typically located at 900 mm from the floor, and storage nests in the common areas. Therefore, there is a danger of collision between the transport assembly or pods carried thereby and an operator in these human/automation common areas. There are known safety procedures in place to prevent an operator from being hurt by the moving transport assembly, but these procedures can be ignored by an operator, thus potentially placing the operator in harm's way.

Another concern with the coexistence of the pod storage and transport system and the fab operators is the potential for damage to the workpieces carried in the pods. When pods are being transported through the human/automation common areas, the moving transport assembly or pods may collide with an operator as described above, or an operator may otherwise try to manually access a pod carried by the robotic gripper. Such contact may result in an abrupt jolt to the workpiece which can cause them to break. The contact may also result in the workpieces being dislodged from their storage shelves within the pod, which may subsequently result in damage to one or more workpieces at a load port when a workpiece handling robot encounters a workpiece at an unexpected position. Contact between the operator and transport assembly or pod can alternatively result in the pod disengaging from the robotic gripper entirely. Currently, each pod may carry in excess of $1 million worth of wafers or other workpieces, and any such damage to the workpieces as a result of contact with an operator can result in significant losses.

A further concern regarding the coexistence of the pod storage and transport system and fab operators is the ease of tool maintenance and the effect of tool maintenance on the overall operation of the transport assembly. Ideally, tool maintenance and the addition or replacement of tools within the tool bay would have no effect on pod delivery to other areas in the fab.

A still further concern is the potential for injury to fab operators or harm to the workpieces in the pods as a result of a pod falling off of the storage nests or the robotic transport gripper. This may occur as a result of seismic activity or, in the event of pod transport, upon failure or breakage of the pod handle by which it is being transported.

SUMMARY OF THE INVENTION

It is therefore an advantage of the present invention to prevent injury to operators as a result of impact with the moving portions of the pod transport assembly or pod within the human/automation common area.

It is another advantage of the present invention to prevent damage to workpieces within a pod as a result of contact with fab operators within the human/automation common area.

It is a further advantage of the present invention to allow maintenance to be performed on a tool without risk of injury to the maintenance operator or damage to pods passing through the maintenance area.

It is a still further advantage of the present invention to allow tools within a tool bay to be maintained, removed, replaced and/or rearranged without affecting pod delivery to other areas within the tool bay.

It is another advantage of the present invention to prevent injury to fab operators and damage to workpieces by providing a system for preventing pods from falling in the event of seismic activity or failure of the pod handle by which a pod is being transported.

It is a further advantage of the present invention to provide redundant hardware and software systems for preventing the transport assembly from entering in the human/automation common area of a tool when an operator is present.

It is a still further advantage of the present invention to provide redundant hardware and software systems for preventing the transport assembly from traveling at high speeds in the human/automation common area.

These and other advantages are provided by a system for safeguarding fab operators and workpieces such as semiconductor wafers from harm as the workpieces are transported between tools and storage nests by a workpiece transport assembly. The safeguarding system comprises a transport system in which all high speed horizontal movement of the transport assembly occurs above 2135 mm and out of the human/automation common areas. Thus a pod gripper may be quickly located at the desired horizontal position without danger of collision between operator and transport assembly. The gripper is affixed to a mast assembly so that, once the gripper of the transport assembly is located at the proper horizontal position, the mast assembly lowers down to the desired height for pod transfer. The mast assembly allows pod transfer from the side of a nest. It is a further feature of the transport assembly that the stationary horizontal rails of the assembly are located above 3500 mm. Thus, any tool conforming to the SEMI standard E72 may be maintained, removed, replaced and/or rearranged without interference with the rails and without affecting pod delivery to other areas within the tool bay.

The safeguarding system according to the present invention further includes a light curtain comprised of a sensor array in front of each of the tools in the human/automation common areas. Each of the respective light curtains at the front of the tools are able to sense when an operator is working at a load port, as a result of portions of the operator's body interrupting one or more of the sensors forming the curtain. The information from the light curtain is forwarded to the circuit providing power to the transport assembly actuators, and is also forwarded to a system host computer.

Each of the tools further includes a safe zone sensor beam comprised of a sensor mounted at each tool above the human/automation common area, at for example a height of approximately 2135 mm. Whenever the mast assembly lowers down into the human/automation common areas in front of a tool, the mast assembly or pod carried thereby will interrupt the safe zone sensor which then transmits this information to the circuit providing power to the transport assembly and to the system host computer.

The safeguarding system in accordance with the present invention includes a redundant system for preventing the transport assembly for entering into the human/automation common area. First, when a light curtain senses the presence of an operator at tool, the system host computer includes a software subroutine that prevents the mast assembly from entering into the human/automation common area of that tool. Additionally, the safeguarding system includes a plurality of hardwired interlock circuits which utilize the information from the light curtain and safe zone sensor beam so that, if at any time both an operator and the transport assembly occupy the same human/automation common area at tool, power is cut to the transport mechanism to thereby prevent injury to the operator and harm to the workpieces within the pods.

The information from the light curtain and safe zone sensor beam is also utilized by the system host computer so that, upon cutting the power to the transport assembly, the system host computer stores the current position and target position of the transport assembly. Upon clearing the conflict at a tool, the system host computer checks to ensure that the location of the transport assembly is the same as when power was cut (via independently powered encoders on the transport assembly), and reinitiates movement of the transport assembly.

The safeguarding system additionally includes a redundant system for ensuring that the transport assembly does not exceed predetermined horizontal and vertical speeds when traveling within the human/automation common areas. In particular, the horizontal and vertical drives of the transport assembly each include encoders which allow the system host computer to monitor the horizontal and vertical location and speed of the mast assembly. The host computer uses the information from the encoders to provide closed loop servo control of the horizontal and vertical drives to ensure that the mast assembly does not exceed the predetermined horizontal or vertical travel speeds when positioned in the human/automation common areas. Additionally, the safeguarding system according to the present invention includes a hardwired velocity circuit which includes a tachometer for monitoring the horizontal and vertical drives independently of the encoders. If the tachometer ever measures a horizontal or vertical travel speed in the human/automation common areas above the predetermined travel speed, power is cut to the transport assembly.

The safeguarding system according to the present invention further includes safety shields for physically closing off the areas between tools which include nests in the human/automation common areas. Safety shields maybe vertically oriented panels that extend down to or near the floor and extend up to a height of approximately 2135 mm. This feature prevents an operator from inadvertently or advertently accessing an area between tools which is also accessed by the transport assembly.

BRIEF DESCRIPTION OF THE DRAWINGS

The present invention will now be described with reference to the figures, in which.

DETAILED DESCRIPTION

The present invention will now be described with reference to FIGS. 1–11 which in general relate to a safeguarding system for preventing impact between an operator and the pod transport system as the transport system moves pods between the various pod nests and load ports within a tool bay. While the pod in the following description may be a 300 mm front opening unified pod (FOUP), it is understood that the type of pod is not critical to the present invention and various other pods may be used. For example, the pod may be a 200 mm bottom opening SMIF pod or a pod that does not operate in accordance with SMIF technology. Moreover, the type of workpieces transported within the pod are not critical to the present invention and may be for example semiconductor wafers, reticles or flat panel displays. A preferred embodiment of the present invention complies with and allows compliance with all applicable SEMI standards. However, it is understood that the present invention need not conform to SEMI standards in alternative embodiments.

Figure 1:
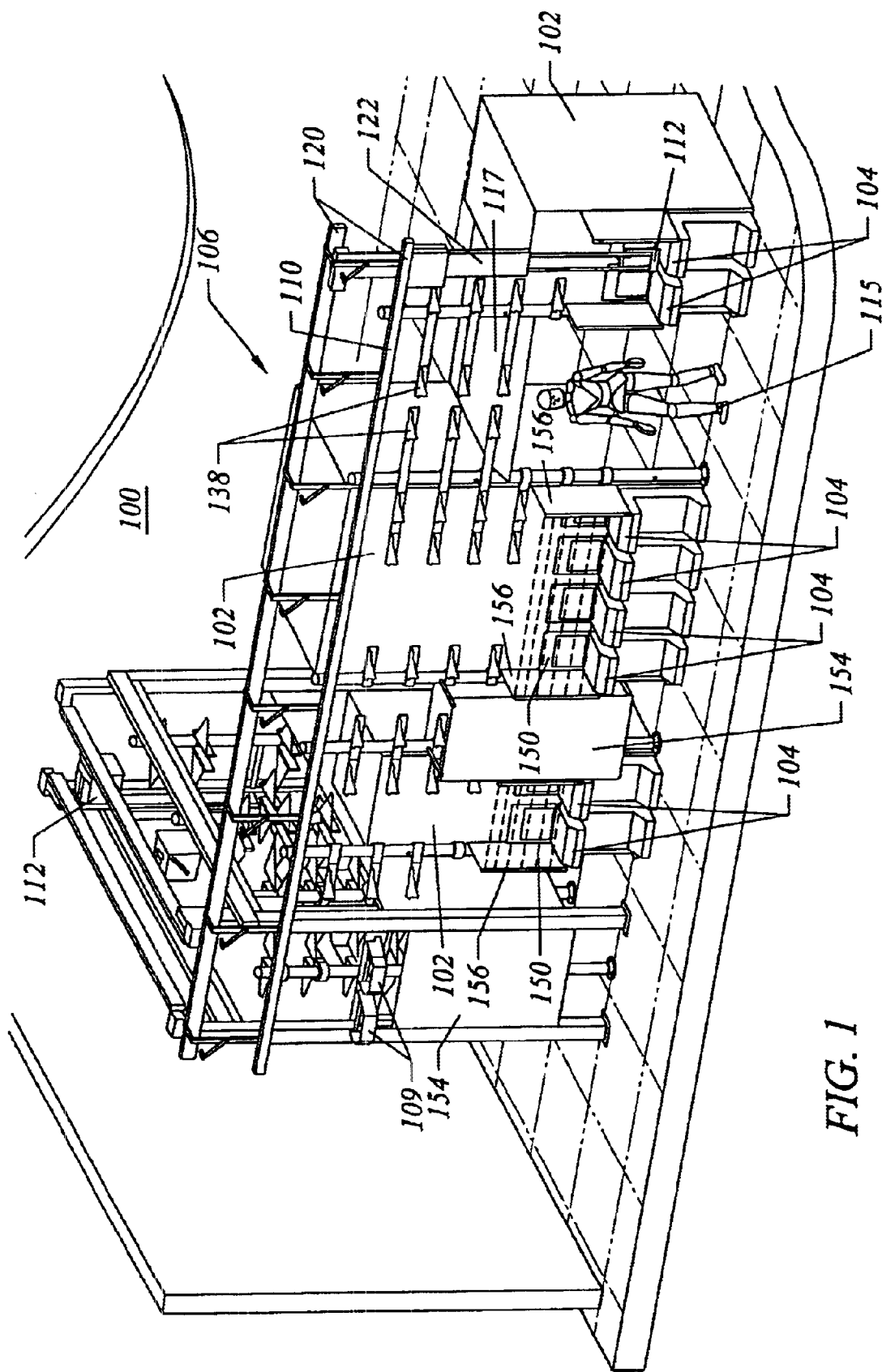
FIG. 1 is a perspective view of a portion of a tool bay including the safeguard system according to the present invention.
Figure 2:
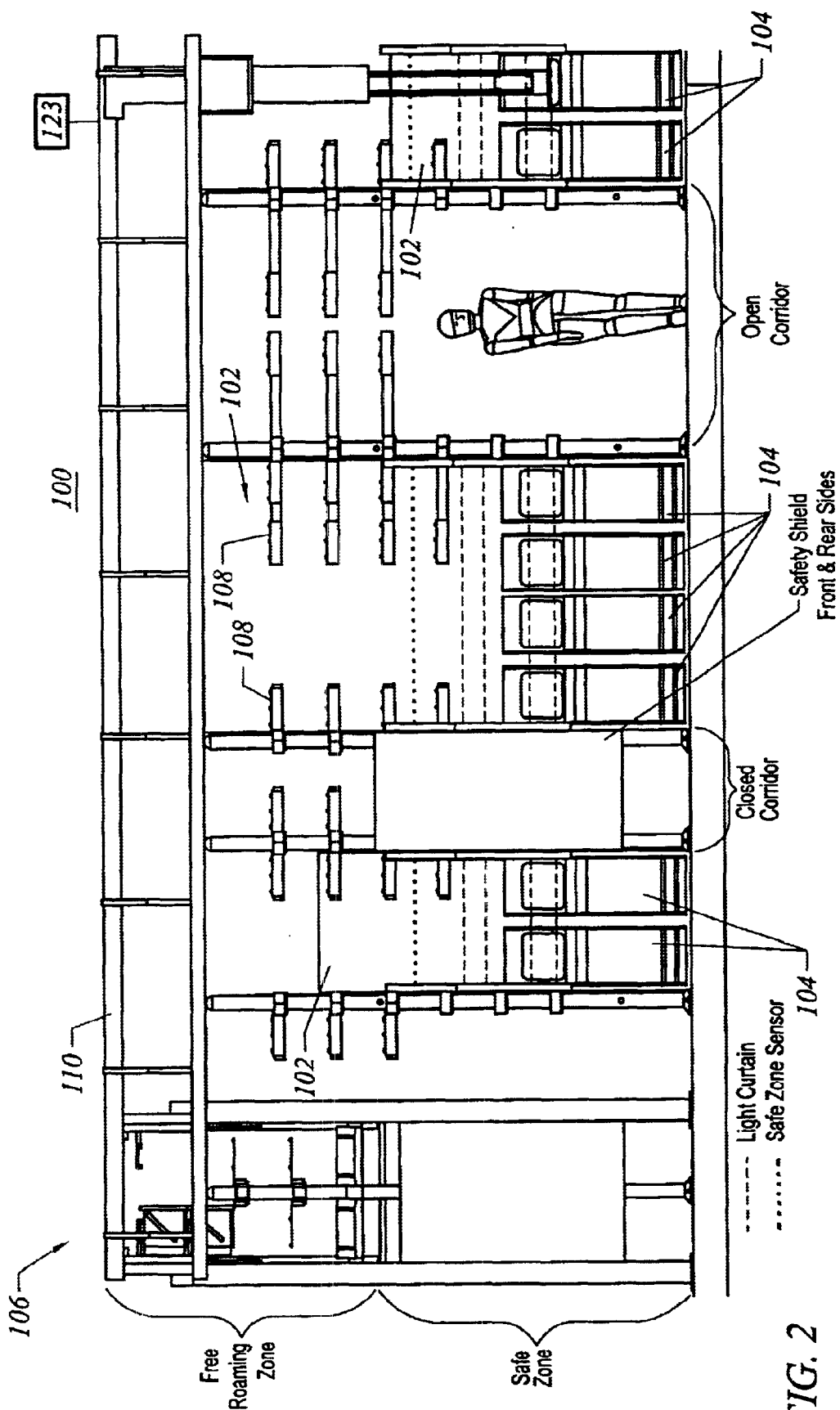
FIG. 2 is a front view of a portion of a tool bay showing the safeguarding system according to the present invention.

Referring now to FIGS. 1 and 2, there is shown at least a portion of a tool bay 100 comprising a plurality of tools 102, each having a plurality of load ports 104, and a storage and transport assembly 106 including a plurality of storage nests 108 and a transport assembly 110. Tool bay 100 further includes a safeguarding system in accordance with the present invention as explained hereinafter.

Tools 102 are not critical to the present invention and may perform any of various known operations on the workpieces including, for example, processing, testing and sorting. The height, width and depth of tools 102 may vary from tool to tool. However, SEMI standard E72 requires that the maximum height of a tool be less than 3500 mm from the floor. As explained hereinafter, the fixed horizontal portions of transport assembly 110 are all located above 3500 mm, thus allowing tools to be added, removed and rearranged without interference with the transport assembly 110.

Each tool 102 includes at least one load port 104 for receiving a pod 112, and opening the pod to allow workpiece transfer between the pod and the interior of the process tool by a workpiece handling robot within the tool. Load ports 104 are not critical to the present invention and may be any of various constructions that are compatible with the pod 112 configuration.

As seen for example in FIGS. 1 and 2, the shelves or storage nests 108 are provided to support pods 112, and may be situated throughout the tool bay for distributed pod storage and local tool buffering. The nests 108 may be positioned in rows and columns, above each other and/or the tool load ports, to thereby provide advantages not found in storage and transport systems utilizing cable hoist pod delivery systems. These advantages, as well as other details relating to nests 108, are described in U.S. Pat. No. 5,980,183 to Fosnight, and U.S. patent application Ser. No. 08/891,543 to Bonora et al., each previously incorporated by reference. The nests 108 may be provided above and within the human/automation common areas. Overhead hoist drop-off stations 109 of known construction may also be provided along the length of the storage and transport assembly 106 of the tool bay to position pods for transport by a second transport assembly to other portions of the tool bay, or to position pods for interbay transport. The second transport assembly may be similar or dissimilar to transport assembly 110.

Figure 8:
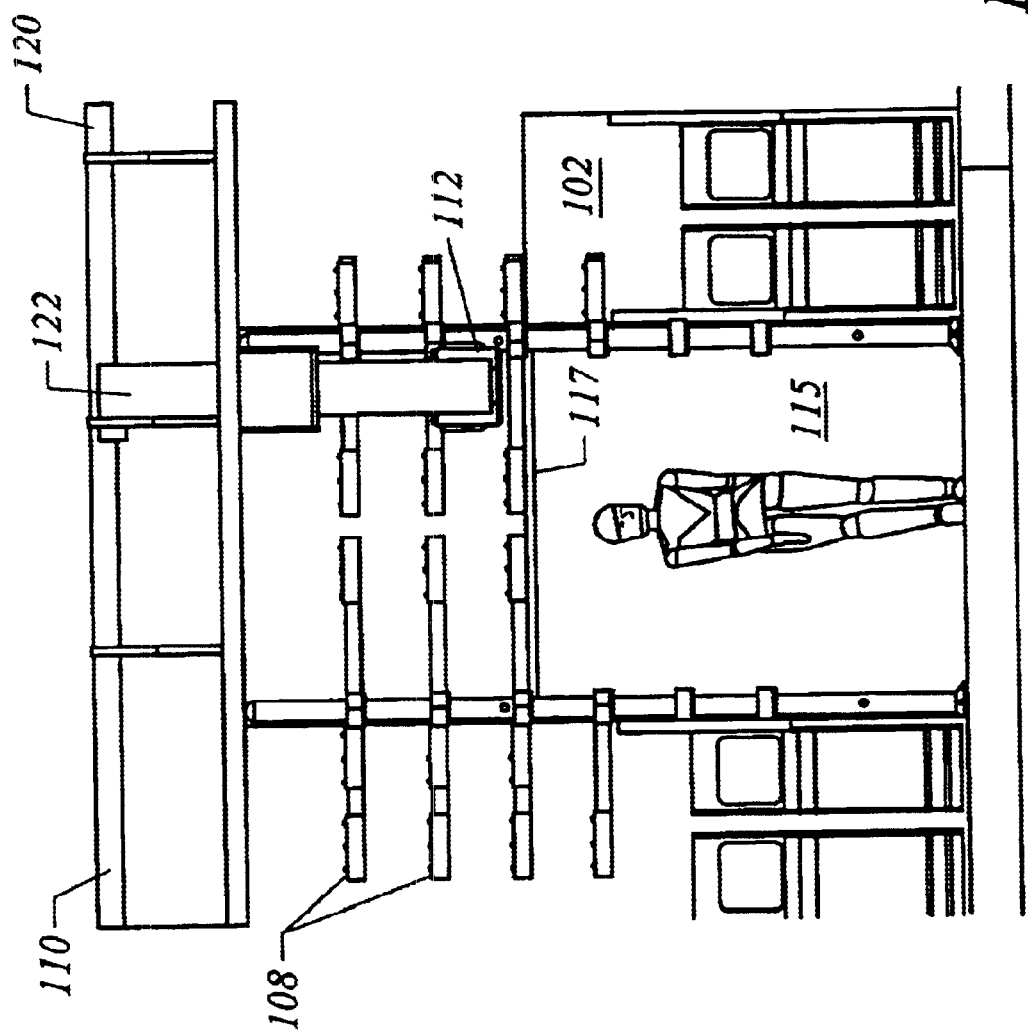
FIG. 8 is an enlarged front view of a portion of a tool bay showing an open corridor walkway and the safeguarding system according to the present invention.

As shown in FIGS. 1 and 8, a tool bay 100 may include open corridors 115 through which operators may pass for maintenance access to the back side of tools 102 and/or for operator flow. Nests 108 may be provided over the open corridors 115 for pod storage. While it is unlikely that a pod would ever fall from above the corridor, a horizontally oriented panel 117 may be provided over the corridor 115 to prevent injury in such an event. The panel 117 may be formed of any of various sturdy materials sufficiently strong to support the weight of a falling pod.

The transport assembly 110 is provided to transport the pods between the various storage nests 108 and tool load ports 104 within tool bay 100. One aspect of the safeguarding system of the present invention relates to the fact that, other than the horizontal movement immediately adjacent a storage nest required to transfer a pod to or from the side of a storage nest, all high speed horizontal motion of the transport assembly within the tool bay occurs above the human/automation common area, which is a preferred embodiment is at 2135 mm. In order to accomplish this, the transport assembly 110 according to the present invention includes a pair of horizontal rails 120 and a vertical travel mast assembly 122 mounted to and riding along the horizontal rails 120.

Rails 120 are mounted along the length of tool bay 100 and may be supported off of the floor and/or ceiling of the bay. Encoders of known construction may be provided in the rails to identify the position of the vertical travel mast assembly along the rails during operation and in the event of a power interruption. Horizontal travel of the mast assembly 122 along the rails may be controlled by a transport assembly controller 123. It is a feature of the present invention that the rails are mounted at least 3500 mm above the floor, which is the maximum height for tools under SEMI Standard E72. Thus, while the height of tools 102 vary, any tool 102 conforming to the standard can be slid into or out of the tool bay underneath the rails without interference with the rails or pod transfer by transport assembly 110 to the sides of the tool being installed or removed. Physical blocks (not shown) may be provided on the rails immediately to the left and right of a tool being moved into or out of the tool bay to physically prevent movement of the vertical travel mast assembly into that area.

While the rails may be mounted just above 3500 mm in a preferred embodiment, it is understood that the rails may be mounted at any height above 3500 mm in alternative embodiments. Moreover, if a particular fab operated only with tools lower than 3500 mm, the rails could be mounted below 3500 mm with the provision that horizontal travel of the mast assembly 122 occur above the human/automation common area as explained hereinafter. It is also understood that the nests 108 and their support structure may be removed as necessary to accomplish tool maintenance, removal, replacement and/or rearrangement.

Vertical travel mast assembly 122 will now be described with reference to FIGS. 1–7. The mast assembly is comprised of fixed mast 124, mast slide 126 and gripper carriage 128. Fixed mast 124 is mounted to the rails 120 so that the fixed mast 124 can ride horizontally along the rails 120 but is itself incapable of vertical movement with respect to rails 120. While many mounting schemes are possible, in one embodiment, the mast assembly includes a first set of rollers rotating about a horizontal axis, which rollers ride on a horizontal surface in a first channel running the length of the lower rail 120. The mast assembly may further include a second set of rollers rotating about a vertical axis, which rollers can bear against spaced vertical walls of a second channel running the length of the upper rail 120. The lower rail 120 supports the weight of the mast assembly by the first set of rollers riding in the first channel. The second set of rollers prevent tilting of the mast assembly about the lower rail as a result of the second rollers being constrained within the second channel. As indicated, other mounting schemes are contemplated.

The mast assembly may be driving along the rails by a linear actuator mounted to the mast assembly. In one embodiment, a fixed belt may be provided on a rail 120, which belt includes a plurality of notches. The mast assembly may include a pulley including notches on its outer circumference that mate within the notches in the fixed belt on the rail 120, such that, upon driven rotation of the pulley, the mast is driven horizontally along the rail, with the direction determined by the direction of rotation of the pulley. The pulley may be driven to rotate by an actuator such as a stepper motor or multiple pole brushless motor. As would be appreciated by those of skill in the art, the mast assembly 122 may be driven horizontally along rails 120 by other actuation systems in alternative embodiments.

Figure 4:
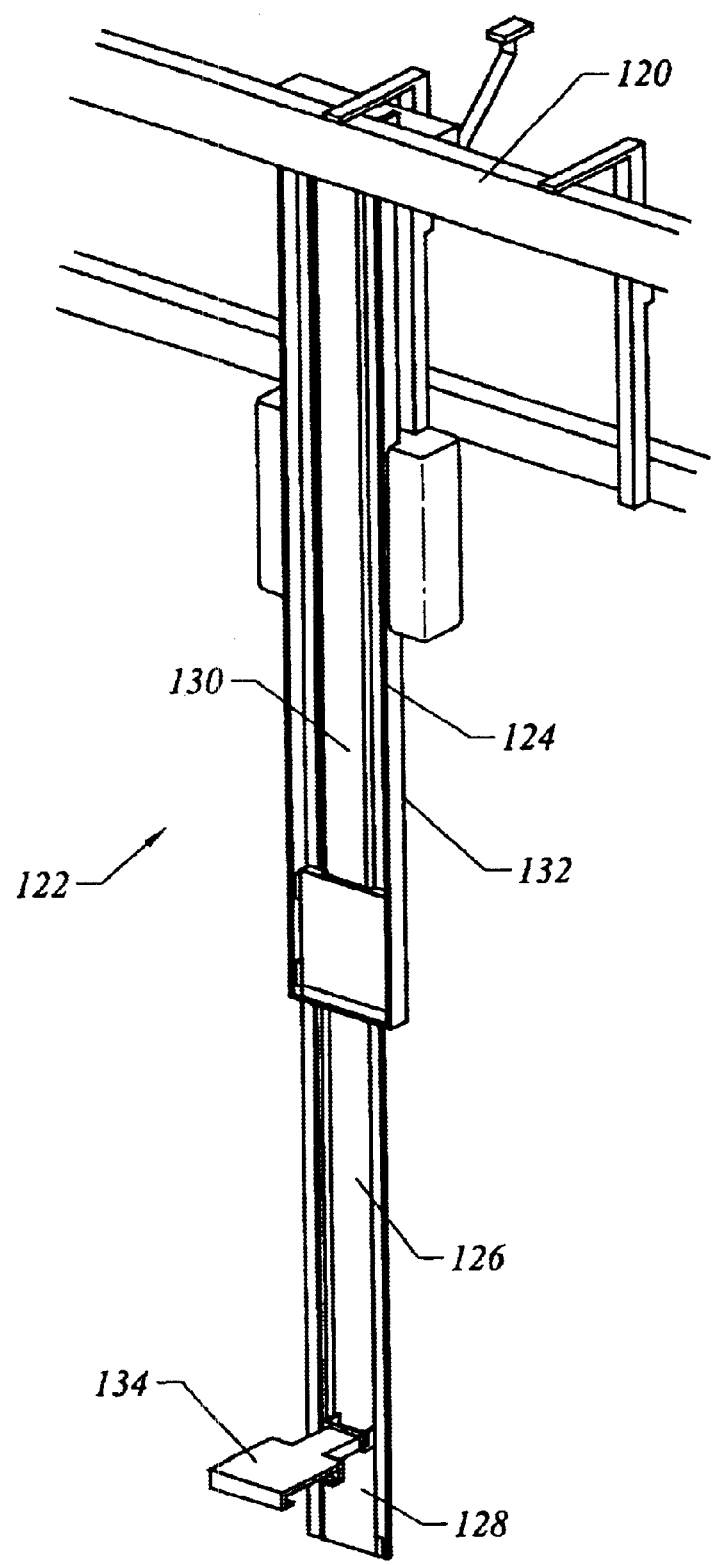
FIG. 4 is a perspective view of the robotic gripper of the transport assembly in accordance with the safeguarding system of the present invention, with the robotic gripper shown at the bottom of its stroke.

As seen for example in FIG. 4, the fixed mast 124 includes a downwardly extending back wall 130 bounded on its sides by a pair of downwardly extending sidewalls 132. The vertical length of fixed mast is provided so that a bottom of the mast lies above the SEMI standard 2135 mm height for fast horizontal travel. Thus, at no time does any portion of the fixed mast extend down into the human/automation common areas.

Figure 3:
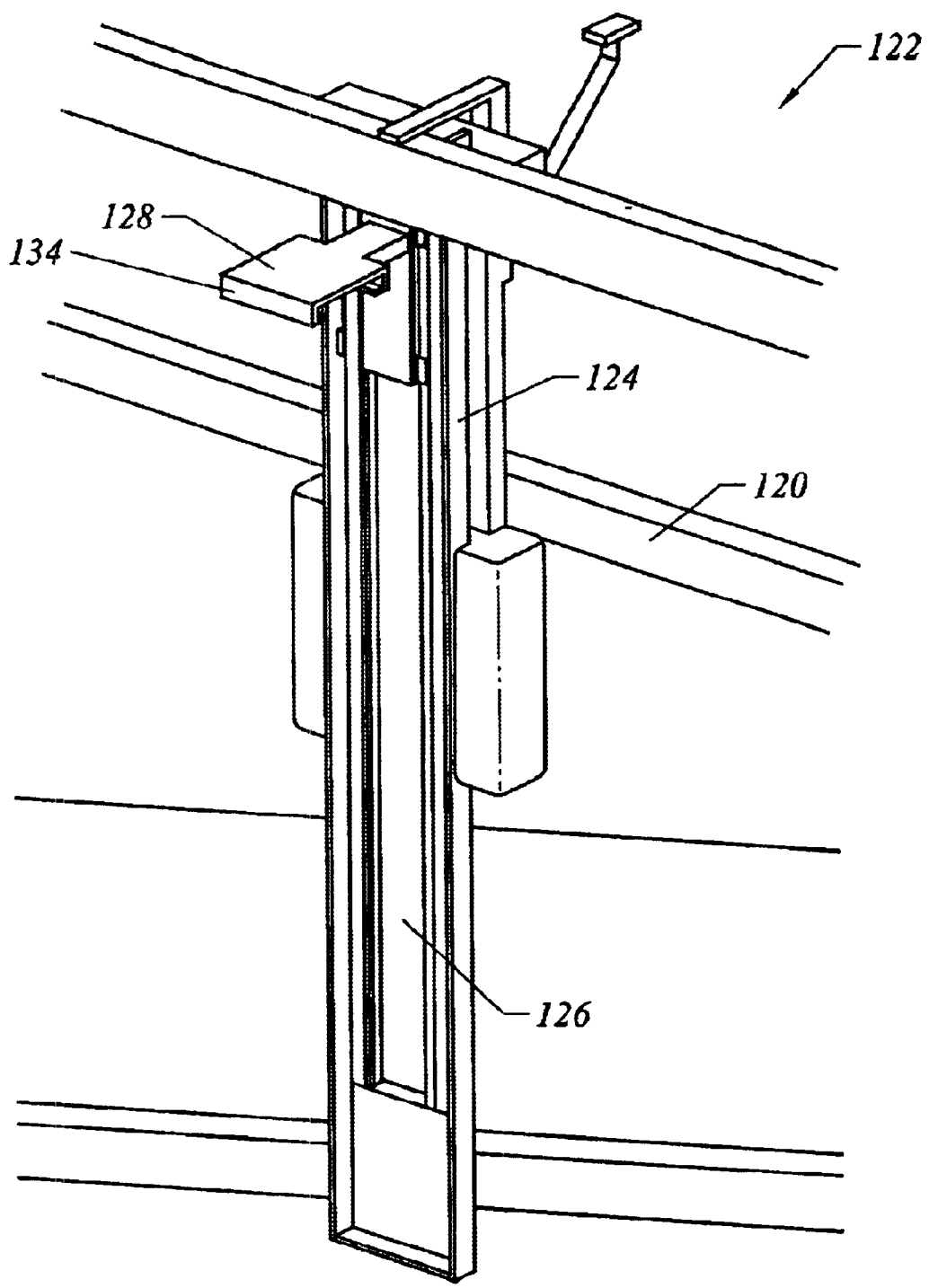
FIG. 3 is a perspective view of the robotic gripper of the transport assembly in accordance with the safeguard system of the present invention, with the robotic gripper shown at the top of its stroke.
Figure 5:
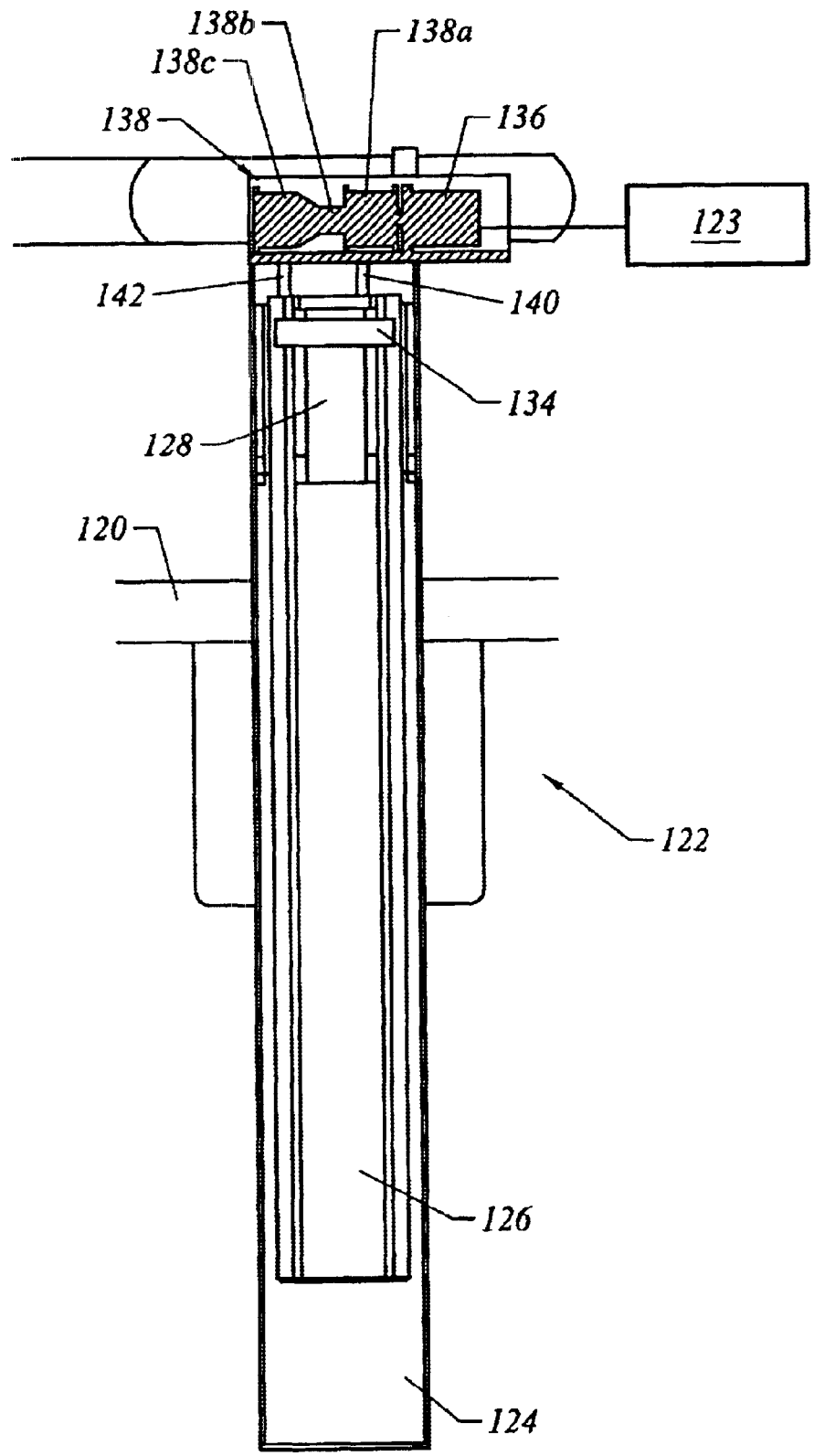
FIG. 5 is a front view of the robotic gripper of the transport assembly according to the safeguarding system of the present invention, with the robotic gripper at the top of its stroke.
Figure 6:
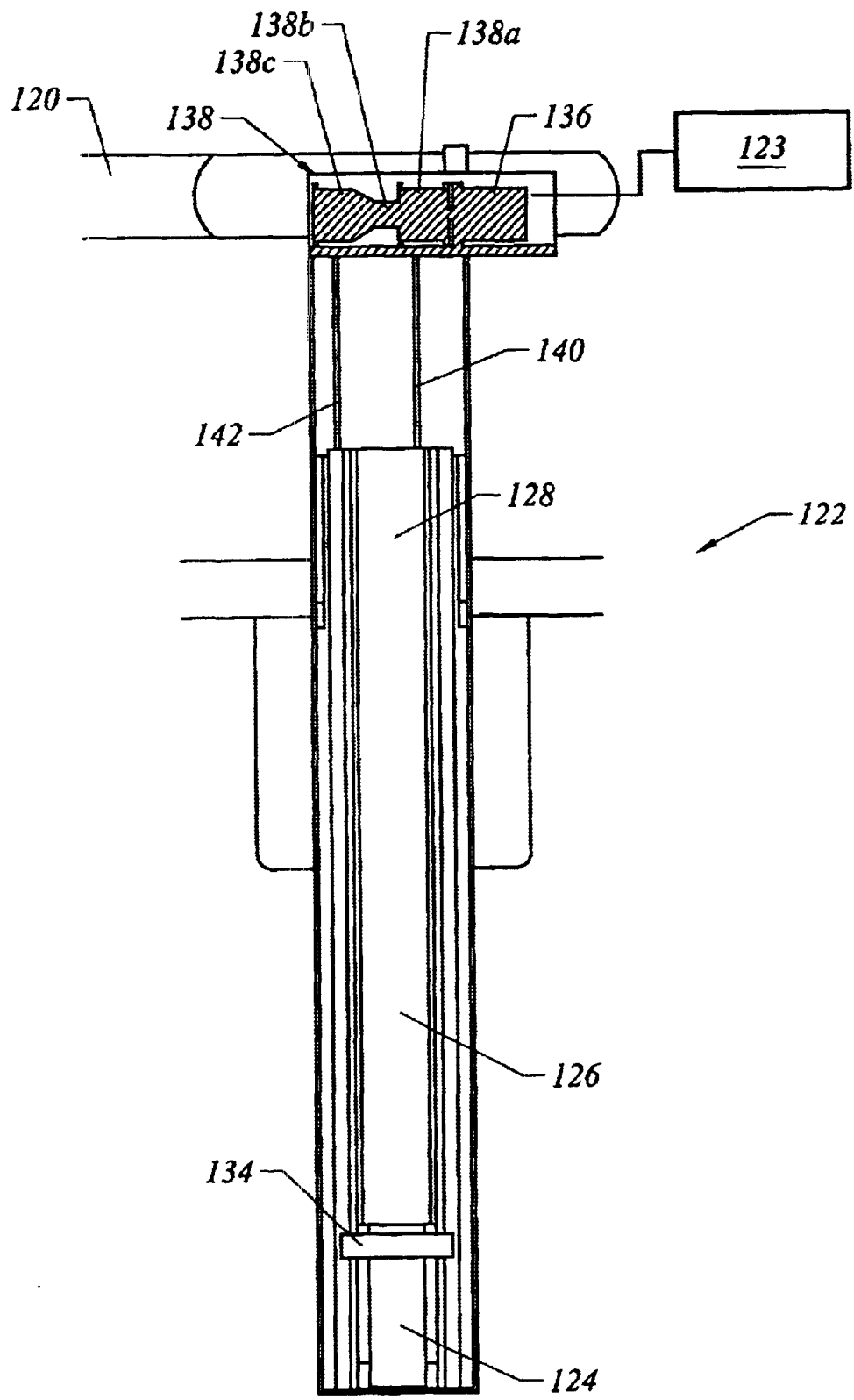
FIG. 6 is a front view of the robotic gripper of the transport assembly according to the safeguarding system of the present invention, with the robotic gripper moving toward the bottom of its stroke.
Figure 7:
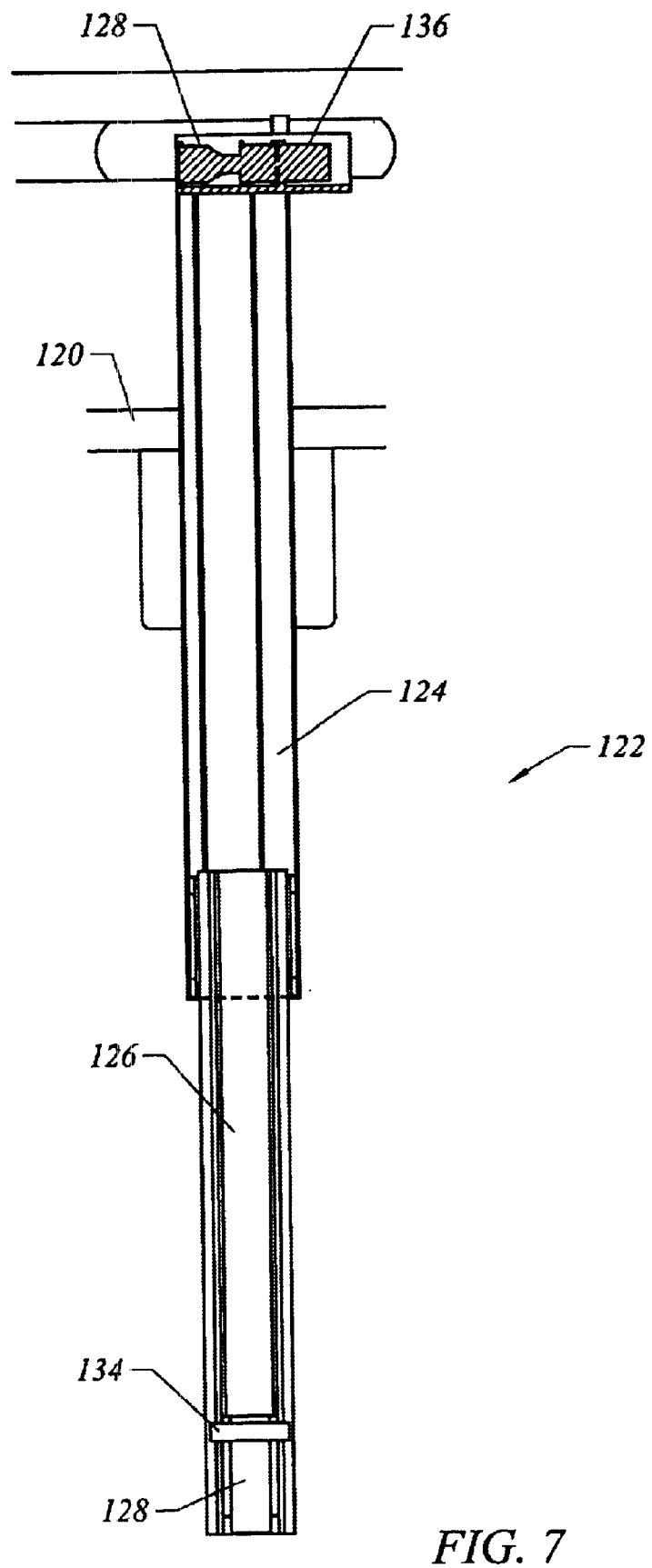
FIG. 7 is a front view of the robotic gripper of the transport assembly according to the safeguarding system of the present invention, with the robotic gripper at the bottom of its stroke.

Mast slide 126 is slidably mounted within the fixed mast 124 so as to vertically translate along the fixed mast between a fully retracted position shown in FIGS. 3, 5 and 6 and a fully extended position shown in FIGS. 4 and 7. The mast slide may be slidably mounted to the fixed mast via linear bearings of known construction. Mast slide 126 is sized so that in a fully retracted position, it fits entirely within fixed mast and no portion extends into the human/automation common areas. When the mast slide 126 is extended out below the fixed mast 124, the mast slide extends into the human/automation common areas.

Gripper carriage 128 is translatably mounted within mast slide 126 so as to vertically translate along the mast slide 126 between a fully retracted position shown in FIGS. 3 and 5 and a fully extended position shown in FIGS. 4 and 7. Thus, the mast slide 126 is capable of vertical movement with respect to the fixed mast 124 and the gripper carriage 128 is capable of vertical movement with respect to the mast slide 126. The gripper carriage may be slidably mounted to the mast slide via linear bearings of known construction.

Gripper carriage 128 includes a gripper 134 for transporting a pod 112 by a handle provided on a top of the pod. Details relating to the gripper 134 are provided in U.S. Pat. No. 5,980,183 previously incorporated by reference. As is further disclosed in U.S. Pat. No. 5,980,183, nests 108 may be replaced by a system supporting the pods from their top handles at the storage locations. In such an embodiment, the gripper carriage 128 may include a cradle for supporting a pod at its bottom surface. The gripper carriage may include a look down sensor of known construction which monitor for obstructions during vertical delivery, side sensors of known construction which monitor for obstructions during horizontal delivery, and a gripper sensor of known construction to indicate when a pod is pushed upward in the gripper.

In a further alternative embodiment, the gripper 134 may be as described above for supporting a handle on the top of the pod, but may additionally include a cradle (not shown) which includes side supports for loosely engaging the sides of the pod when the pod is gripped in gripper 134. The side supports prevent the pod from swaying when during high speed transport or otherwise, and also prevent flexing of the pod handle within gripper 134 to prevent fatigue to the handle. The cradle may additionally include a bottom portion slightly spaced from the bottom of a pod when supported in the gripper, which prevents a pod from falling off the gripper carriage 128 in the unlikely event it detaches from gripper 134.

Referring now to FIGS. 5–7, in a preferred embodiment, a motor 136 is mounted to the upper rail 120 for lowering both the mast slide 126 and gripper carriage 128 with respect to the fixed mast 124. The motor is preferably a stepper motor or multi-pole brushless type motor, and includes an encoder for providing closed loop servo control of the rotation of the motor and the vertical position of the gripper 134 as explained below. Rotation of the motor may be controlled by the transport assembly controller 123. The motor 136 includes a variable diameter spool 138 affixed to the output shaft of the motor, which spool 138 includes sections 138a, 138b and 138c. Each of the section are affixed to each other and rotate with the same angular velocity. Sections 138a and 138c preferably have the same diameter, and section 138b preferably has a smaller diameter, which diameter of section 138b increases along a slope until it matches that of section 138a and 138c.

A cable 140 has a first end affixed to the section 138a and a second end affixed to the gripper carriage 128. The gripper carriage cable 140 is fully wound around the section 138 when the gripper carriage 128 is in a fully retracted position. Upon rotation of the spool section 138a in a first direction by the motor 136, the cable 140 unwinds from the spool and the gripper carriage 128 moves downward under its own weight. To retract the gripper carriage, the motor rotates in the opposite direction so that the cable winds back around the section 138a.

A cable 142 has a first end affixed to section 138c and a second end affixed to the mast slide 126. The cable is fully wound around the sections 138b and 138c when the mast slide is in a fully retracted position. Upon rotation of the spool sections 138b, 138c by the motor 136, the cable unwinds from section 138b first and then section 138c. Upon unwinding of the cable, the mast slide 126 moves downward under its own weight. To retract the mast slide, the motor rotates in the opposite direction so that the cable winds back around the sections 138c first and then 138b.

The linear velocity, v, that the mast slide and gripper carriage will move downward is given by the formula:

$$v = (r)(\omega),$$

where r is the radius of the spool section and $\omega$ is the angular velocity of the spool 138. Therefore, as shown in FIG. 6, owing to the smaller radius of section 138b from which the mast slide cable 142 initially unwinds, the mast slide will move downward more slowly than the gripper carriage. In particular, as shown in FIG. 6, the radius of section 138b is controlled so that, when the mast slide cable 142 is fully unwound from the section 138b, the mast slide has moved down a small amount but the gripper carriage has moved to the bottom of the mast slide. Thereafter, continued rotation of the motor will unwind mast slide cable 142 from the section 138c and the gripper carriage cable 140 from the section 138a. As sections 138a and 138c are the same radius, the mast slide and gripper carriage will move downward from the position shown in FIG. 6 to the position shown in FIG. 7 at the same speed, i.e., the mast slide moves downward in the fixed mast, but there is no further relative movement between the mast slide and gripper carriage.

Thus, in general, the mast assembly 122 will move vertically from a retracted position to an extended position with the gripper carriage moving downward at a constant velocity. The mast slide initially moves downward more slowly until the point at which the gripper carriage reaches the bottom of the mast slide. Thereafter, the mast slide and gripper carriage move downward at the same velocity until both reach their desired vertical position as dictated by transport assembly 123. Rotation of the motor in the opposite direction will cause the mast slide and gripper carriage to move to their retracted positions by an opposite motion than for extension. While a preferred embodiment of the motions of the mast slide and gripper carriage upon rotation of the motor has been described, it is understood that the mast slide and gripper carriage may move downward and upward according to different motion sequences in alternative embodiments.

It is understood that the mast slide and gripper carriage may be moved as described above by other mechanisms than motor 136 and variable diameter spool 138. For example, it is understood that the cables 140 and 142 may be affixed to two separate motors, capable of rotating independently.

In a further alternative embodiment of the mast assembly 122, gripper carriage 128 may be affixed to motor 136 by gripper carriage cable 140 as described above. However, instead of the mast slide being connected to the motor, the mast slide is connected to the fixed mast via a spring extending between a top portion of the mast slide and a top portion of the fixed mast, which spring biases the mast slide upward to a retracted position with respect to the fixed mast. In this embodiment, the spring constant is provided such that the spring force is stronger than the gravitational force on the mast slide alone, or alternatively, the spring force becomes stronger than the gravitational force on the mast slide alone upon a small downward stroke of the mast slide in the fixed mast. Thus, when the spring bears only the weight of the mast slide, the mast slide moves downward only slightly or not at all and stays retracted within the fixed mast.

Conversely, the spring constant is also provided such that the spring force is weaker than the gravitational force of the mast slide and gripper carriage together.

When the gripper carriage cable 140 unwinds initially from a fully retracted position, the spring bears the weight of only the mast slide; the weight of the gripper carriage is born entirely by the gripper carriage cable 140. Thus, initially, the gripper carriage moves downward in the mast slide, but the spring holds the mast slide within the fixed mast. Once the gripper carriage reaches a bottom position in the mast slide, the weight of the gripper carriage is added to the mast slide, and both the mast slide and gripper carriage act against the spring. At this point, the mast slide and gripper carriage move downward together upon continued rotation of the motor and unwinding of the gripper carriage cable 140.

Upon rotation of the motor in the opposite direction when the mast slide and gripper carriage are in an extended position, the cable lifts the gripper carriage upward. As the cable removes the weight of the gripper carriage from the spring, the spring pulls the mast slide upward with the gripper carriage until the mast slide is fully retracted into the fixed mast. At this time, further rotation of the motor will retract the gripper carriage upward with respect to the mast slide. To the extent that the weight of mast slide against the spring causes the mast slide to move downward slightly with respect to the fixed mast, once the gripper carriage retracts to a top position in the mast slide, the gripper carriage will pull the mast slide upward with it to a fully retracted position upon continued retraction of gripper carriage cable 140.

The vertical travel mast assembly 122 as described above moves horizontally along rails 120 at a high rate of speed with the mast slide 126 and gripper carriage 128 in a retracted position. Thus, all such high speed horizontal movement occurs with the mast assembly 122 above 2135 mm. Subject to the safeguarding features of the present invention described hereinafter, once the mast slide assembly 122 is positioned at the correct horizontal position on the rails, the transport assembly controller 123 rotates the motor 136 to lower the gripper to the desired vertical position, either above or below 2135 mm, to transfer a pod to or from a load port or nest. Once lowered to the proper height, the gripper may move horizontally on the rails slightly to move over a load port or nest from the side.

In a preferred embodiment, the transport assembly controller 123 preferably controls motor 136 so that vertical moves performed in the human/automation common area below for example 2135 mm are performed at a slower speed than vertical moves above the human/automation common area. In one embodiment, vertical and horizontal moves in the human/automation common areas occur at 10 inches per second. It is understood that vertical and/or horizontal moves in the human/automation common areas maybe performed at higher or lower speeds than that in alternative embodiments.

Referring in particular now to FIGS. 1, 2, 8 and 9, the safeguarding system in accordance with the present invention further includes light curtains 150, safe zone sensor beams 152 and safety shields 154 for preventing contact between the fab operator and the pod transport system in the human/automation common areas.

Each tool 102 includes its own dedicated light curtain 150. While the following description is of a single light curtain 150, the following description applies to the light curtains at each of the tools 102. Light curtain 150 is comprised of a plurality of break-the-beam sensors for emitting a plurality of beams across the front of each of the tools 102. In particular, as indicated on FIG. 1, each of the load ports includes a pair of side panels 156 extending out from tools 102 adjacent load ports 104. A plurality of transmitters are mounted to along the front edge (i.e., distal from the tool 102) of one of the side panels 156. The emitter emits a beam of light across the front of tool 102 to be received within a plurality of corresponding receivers provided down the front edge of the opposite side panel. Side panels 156 are spaced away from the front of the process tool so that the mast assembly 122 and pods 112 are able to lower behind the curtain, i.e., between the curtain 150 and the tool 102, to the load ports and nests without breaking any beam in the curtain.

The respective emitters and receivers of curtain 150 may be spaced approximately 30 mm from each other to create the light curtain 150 in front of the process tool 102. It is understood that the spacing between the sensors in the curtain 150 may vary in alternative embodiments. The curtain may also extend between 900 mm and 1700 mm from the floor in a preferred embodiment. However, the curtain may extend above and below those heights, or be narrower than that, in alternative embodiments.

The light curtains 150 are provided to sense when an operator is working at a load port. In particular, when an operator is working at a tool 102, portions of the operator's body will interrupt one or more of the break-the-beam sensors, which results in a change in state in the one or more sensors that is forwarded to an interlock circuit for controlling power to the transport assembly. The change of state is also forwarded to a system host computer. Thus, the safeguarding system in accordance with the present invention is able to identify the presence of an operator at a particular tool 102. In an alternative embodiment, where an operator is to be stationed at a tool for a prolonged period of time, each respective tool 102 may include an activator which, when manually activated by the operator, would have the same effect as breaking one or more of the beams of light curtain 150. Manual activation would register in the interlock circuit and system host computer would note the presence of an operator at the tool for a predefined period of time and/or until manual deactivation by the operator. It is noted that the embodiment utilizing this manual activation system would also still use light curtain 150 as described above.

Once the light curtain 150 identifies the presence of an operator at a load port via light curtain 150, the safeguarding system in accordance with the present invention prevents the mast assembly 122 of transport assembly 110 from lowering into or passing through the area of the load port as explained hereinafter.

While a preferred embodiment of light curtain 150 has been described above, those of skill in the art will appreciate that light curtain 150 may be formed by other means in alternative embodiments. For example, sensors other than break-the-beam sensors may be used in alternative embodiments including other optical and proximity sensors. Moreover, it is contemplated that instead of light curtain 150, the floor of the tool bay in front tools 102 may include weight sensors such as, for example, piezoelectric sensors for sensing the presence of an operator near a particular tool 102. Further, instead of light curtain 150, each tool may be covered by a mechanical door. When an operator needs to access the tool 102, he/she manually or automatedly (as by pushing a button) opens the door, which can slide down, to the side or open away from the tool on hinges. The opening of the door would generate a signal just as breaking the light curtain described above.

Additionally, in a further alternative embodiment, instead of each tool including its own dedicated light curtain 150, a single light curtain 150 may be provided including transmitters at one end of the tool bay and receivers at the opposite end of the tool bay so that a single light curtain is provided for each of the tools together. In this embodiment, any time an operator was at any of the tools 102 in the bay, the safeguarding system according to this embodiment would prevent the transport assembly from lowering into the human/automation common area.

Each tool 102 preferably includes its own dedicated safe zone sensor beam 152. While one such sensor beam 152 is described hereinafter, the following description applies to each of the sensor beams 152. Safe zone sensor beam 152 is comprised of a break-the-beam sensor mounted at each tool for detecting when mast assembly 122 lowers into the human/automation common area. In particular, a break-the-beam sensor is mounted at the side of each tool 102 at a height of approximately 2135 mm in a preferred embodiment. It is understood that the height of the emitter may be lower than that, for example at 2100 mm, in alternative embodiments. The break-the-beam safe zone sensor emitter emits a light beam across the front surface of the tool 102 to a corresponding receiver on the opposite side of the tool.

Whenever the mast assembly 122 lowers into the human/automation common areas in front of a tool, the mast assembly or pod carried thereby will interrupt the safe zone sensor beam 152, which results in a change in state in the sensor that is forwarded to the interlock circuit for controlling power to the transport assembly. The change of state is also forwarded to the system host computer. Thus, the safeguarding system in accordance with the present invention is able to identify when the mast assembly is being lowered into a human/automation common area in front of a tool 102. It is understood that sensors other than a break-the-beam sensor may be used in alternative embodiments.

As the safeguarding system according to the present invention is able to sense whether an operator is present at a tool 102, and is able to sense whether the mast assembly is lowering down into a human/automation common area in front of a tool 102, the system is able to prevent conflict where both an operator and the mast assembly occupy space in front of a tool 102. Thus, harm to fab operators and workpieces within the pods 112 is avoided.

In a further aspect of the present invention, in order to guard against harm to operators or workpieces in the event of a system control failure, the present invention includes redundant systems utilizing both the host computer and a hardwired interlock circuit for preventing the transport assembly from entering into the human/automation common area. Thus, in the unlikely event that host computer fails to detect and prevent potential conflict within the human/automation common area, the interlock circuit ensures that the transport assembly does not operate at a tool at which an operator is present.

Regarding the first of the redundant conflict prevention systems, when a light curtain 150 senses the presence of an operator at tool, the system host computer includes a software subroutine that prevents the mast assembly from entering into the human/automation common area of that tool. In particular, upon detection of an operator at a tool 102, if the system host computer is scheduled to pick up or drop off a pod in the human/automation common area of that tool, the host computer can stop the transport assembly 110 from entering the area a user-defined period of time prior to entry of the transport assembly. For example, if the system host computer has a scheduled delivery to a load port or nest at a tool 102, and an operator is sensed at the tool, the system host computer can stop the transport assembly five seconds before it enters the human/automation common area of that tool. It is understood that the period of time used by the host computer may be greater or less than five seconds in alternative embodiments.

Once stopped, the host computer may wait a user-defined period of time for the operator to leave the tool, as indicated by the light curtain 150. If the operator leaves the tool within this user-defined period, then the system host computer can complete its scheduled pick-up or delivery. Alternatively, if the user-defined period of time passes and the operator is still at the tool, the system host computer can direct the mast assembly to store the pod (in the event the mast assembly was carrying a pod for delivery) and perform its next scheduled delivery or pick-up. The unfinished delivery or pick-up can be rescheduled for a later time. It is understood that in alternative embodiments, the system host computer may be configured not to wait, but instead to store a carried pod and/or proceed directly to the next scheduled pick-up/delivery immediately upon detecting an operator at a tool in the area of a scheduled delivery.

Regarding the second of the redundant conflict prevention systems, a plurality of hardwired interlock circuits are provided for shutting down power to the transport assembly in the event a conflict is detected within the human/automation common area of a tool to prevent any movement of the transport assembly while an operator is at the tool. The safeguarding system includes a plurality of interlock circuits 158 as shown in FIGS. 10A–10E, one interlock circuit for each light curtain 150 and safe zone sensor beam 152 pair. Each of the interlock circuits is connected in series so that power to the transport assembly is shut off in the event any one of the circuits detects a conflict at a tool. One such interlock circuit 158 is explained hereinafter, but the description applies to each such circuit.

Figure 10A:
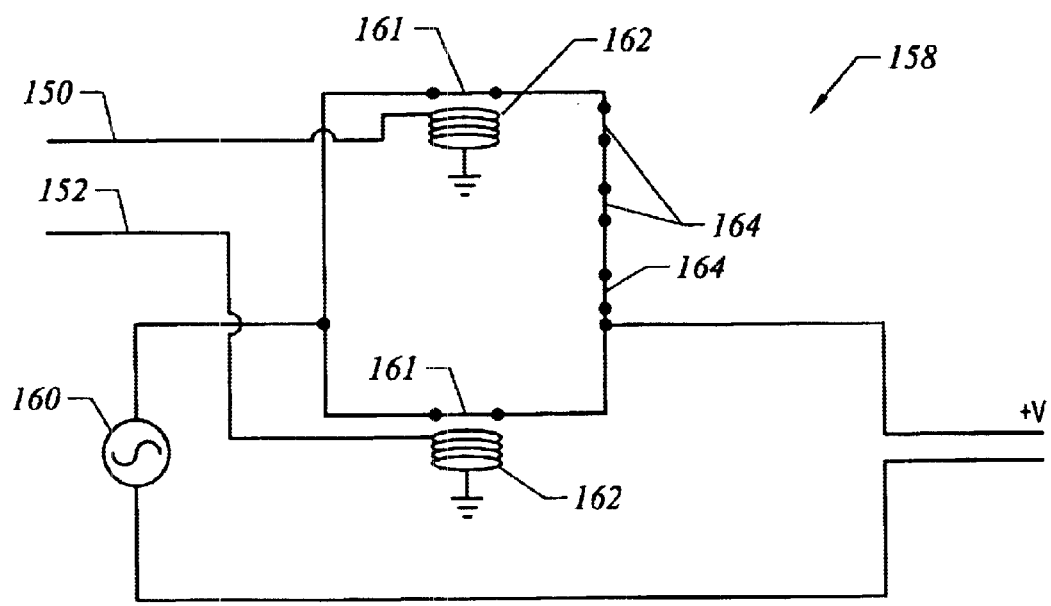
FIGS. 10A–10E are block diagrams of an electrical circuit for controlling operation of the transport assembly in accordance with the safeguarding system of the present invention.

The interlock circuit operates as a logic OR gate, receiving its inputs from the light curtain 150 and safe zone sensor beam 152. In particular, as shown in FIG. 10A, interlock circuit 158 includes a current source 160 connected in series with first and second switches 161. The normally open switches are opened and closed by an actuator 162 such as a solenoid or electromagnet. When a voltage is received in an actuator 162, its corresponding switch 161 closes. Voltages are received in an actuator 162 depending on whether the light curtain detects an operator and/or the safe zone sensor detects the mast assembly.

As shown in FIG. 10A, if there is no operator at the tool as sensed by the light curtain, a voltage is sent to the first circuit input, thereby closing the first switch 161. Similarly, if the safe zone sensor beam does not detect the mast assembly 122 entering the area of the tool, a voltage is sent to the second circuit input to close the second switch 161. As neither an operator or the mast assembly is present at the load port, the transport assembly should function as normal. With both switches 161 closed, an output voltage, $^+V$, is generated and forwarded to the transport assembly controller 123 via an FPGA 188 (FIG. 12) explained hereinafter. This voltage directs the controller 123 to provide power to the actuator which drives the mast assembly 122 horizontally along the rails 120, and to provide power to the motor 136 which extends and retracts the mast assembly vertically.

Figure 10B:
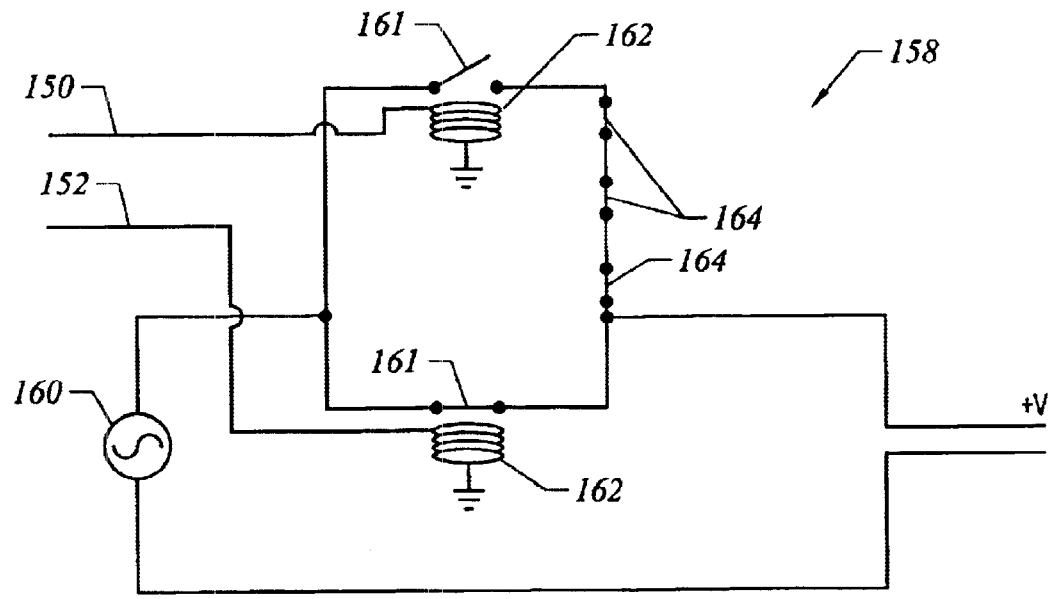

If an operator is present at the tool 102, but the mast assembly is not within the human/automation common area of the tool 102, the transport assembly should function as normal. This situation is handled by the interlock circuit as shown in FIG. 10B. The light curtain 150 detects an operator at the tool 102, so no voltage is sent to the first input and the first switch 161 opens. However, the safe zone sensor 152 does not detect the mast assembly 122 in the human/automation common area of tool 102, and a voltage is sent over the second input to close the second switch 161. In this event, current from source 160 can flow through the second switch and the output voltage, $^+$V, is generated and forwarded to the controller 123 to drive the transport assembly 110.

Figure 10C:
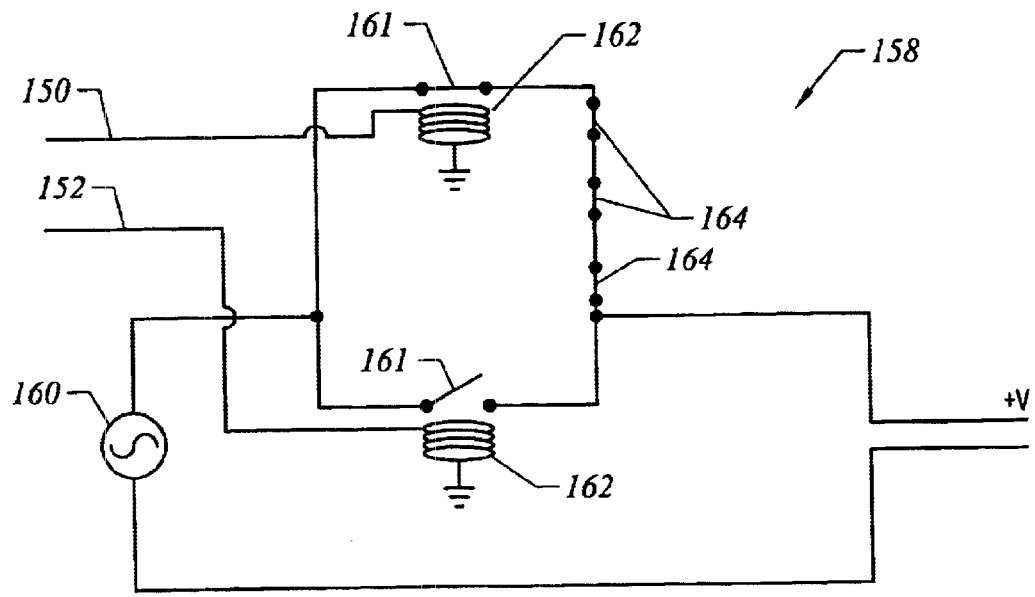

If the mast assembly is present within the human/automation common area at the tool 102, but there is no operator present at the tool 102, the transport assembly should function as normal. This situation is handled by the interlock circuit as shown in FIG. 10C. The light curtain 150 detects no operator at the tool 102, so a voltage is sent to the first input and the first switch 161 closes. However, the safe zone sensor 152 detects the mast assembly 122 in the human/automation common area of tool 102, so no voltage is sent over the second input and the second switch 161 opens. In this event, current from source 160 can flow through the first switch and the voltage, $^+$V, is generated and forwarded to the controller 123 to drive the transport assembly 110.

Figure 10D:
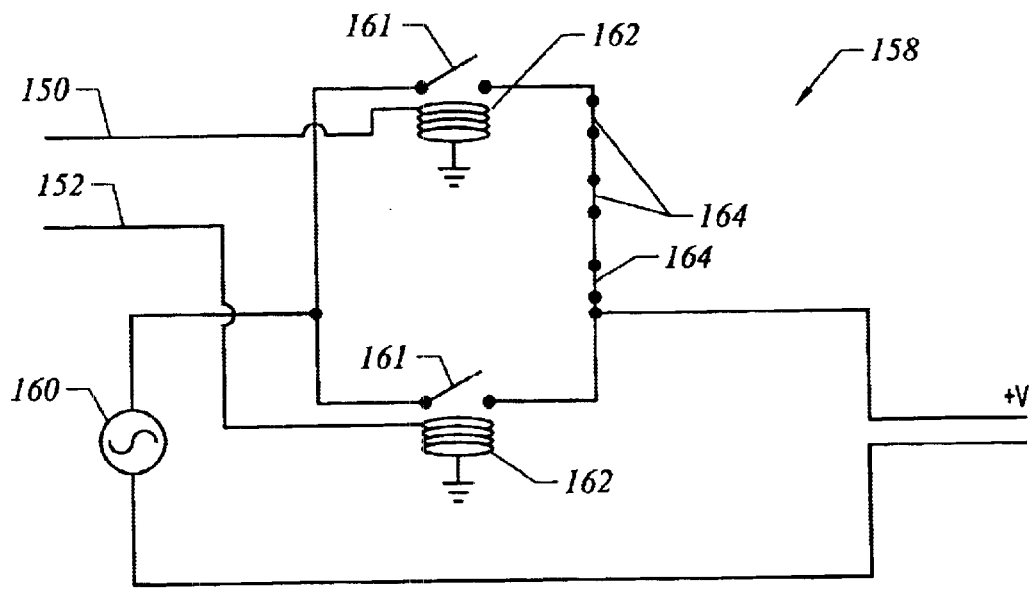

However, if an operator is at a tool and the mast assembly attempts to enter the human/automation common area of the tool (in the case of a host computer malfunction), or if the mast assembly is in the human/automation common area of a tool and an operator approaches the tool, the safeguarding system according to the present invention stops the transport assembly 110 to prevent injury to the operator and harm to the workpieces within the pods. This situation is handled by the interlock circuit as shown in FIG. 10D. The light curtain 150 detects an operator at the tool 102, so no voltage is sent to the first input and the first switch 161 opens. Similarly, the safe zone sensor 152 detects the mast assembly 122 in the human/automation common area of tool 102, so no voltage is sent over the second input and the second switch 161 opens. In this event, no current flows through interlock circuit 158, and no output voltage is generated. Having not received the power signal from the interlock circuit 162, the controller 123 shuts down power to the transport assembly. The transport assembly 110 may include a braking system as is known in the art for applying a braking force to the horizontal and vertical motion of the transport assembly in the event of a loss of power as described above. Thus, upon detection of a conflict at a tool 102, the transport assembly stops moving.

The hardwired interlock circuit 158 of the safeguarding system provides a failsafe method of shutting down the transport assembly in the event a conflict is detected at a tool 102. However, as would be appreciated by those of skill in the art, the described interlock circuit 158 is merely exemplary, and a great many other hardwired circuit configurations are contemplated for shutting down operation of the transport assembly 110 upon a detected conflict at any one of the tools 102. Moreover, instead of a hardwired circuit for controlling power to the transport assembly, the power to the transport assembly can be controlled entirely by the system host computer electronically in alternative embodiments.

Figure 10E:
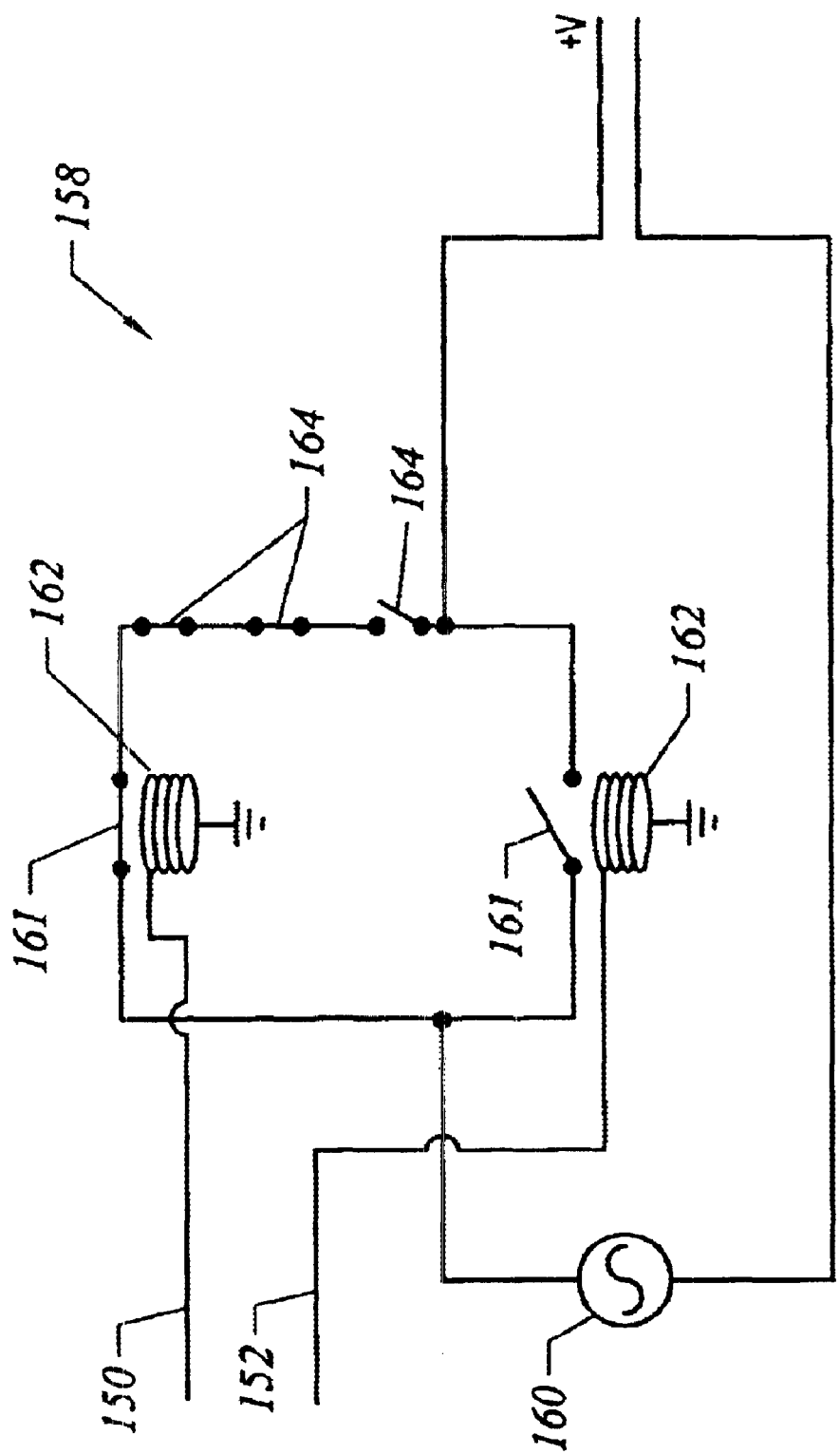

FIGS. 10A–10E further show E84 switches 164 connected in series with the light curtain switch 161. There is one E84 switch 164 for each load port 104 at a tool 102. In accordance with SEMI Standard E84, and as shown in FIG. 10E, in the event of an error or emergency condition is sensed at one or more of the load ports 104 of a tool 102, a signal is forwarded to the system host computer. A signal is also generated which causes the switch 164 associated with the problem load port to open. An open switch 164 in association with the safe zone sensor 152 sensing the mast assembly within the human/automation common area prevents the $^+$V voltage from being generated and consequently the transport assembly is shut down. Preferably, the host computer detects the error or condition at the tool 102 before the transport assembly enters that area and diverts the transport assembly elsewhere as described above. However, in the event the condition is not detected until the transport assembly arrives at the area of the tool, the interlock system shuts down power to the transport assembly.

It is understood that where the system host computer is functioning properly to detect and prevent the transport assembly from entering an area occupied by an operator as described above, the interlock circuits 158 will not encounter a situation where it is required to shut down power to the transport assembly as a result of the transport assembly attempting to enter an area occupied by an operator. Where the system host computer is working properly, the interlock circuit will shut down power only upon an operator entering an area already occupied by the transport assembly. However, in accordance with the redundant features of the present invention, in the event the host computer malfunctions, the interlock circuit prevents the transport assembly from entering the area of a tool occupied by an operator.

In addition to a redundant system for preventing conflict between transport assembly and operator within the human/automation common area, the present invention further includes a redundant system for preventing the mast assembly from traveling vertically or horizontally within the human/automation common area. As indicated in the Background of the Invention section, SEMI Draft Document 2843D requires that all high speed transport of pods by the transport assembly occur above 2135 mm. As the system host computer is aware of the position of the mast assembly at all times, it controls the vertical and horizontal speed to be below a predetermined maximum when portions of the mast assembly are traveling vertically or horizontally below 2135 mm.

Figure 11:
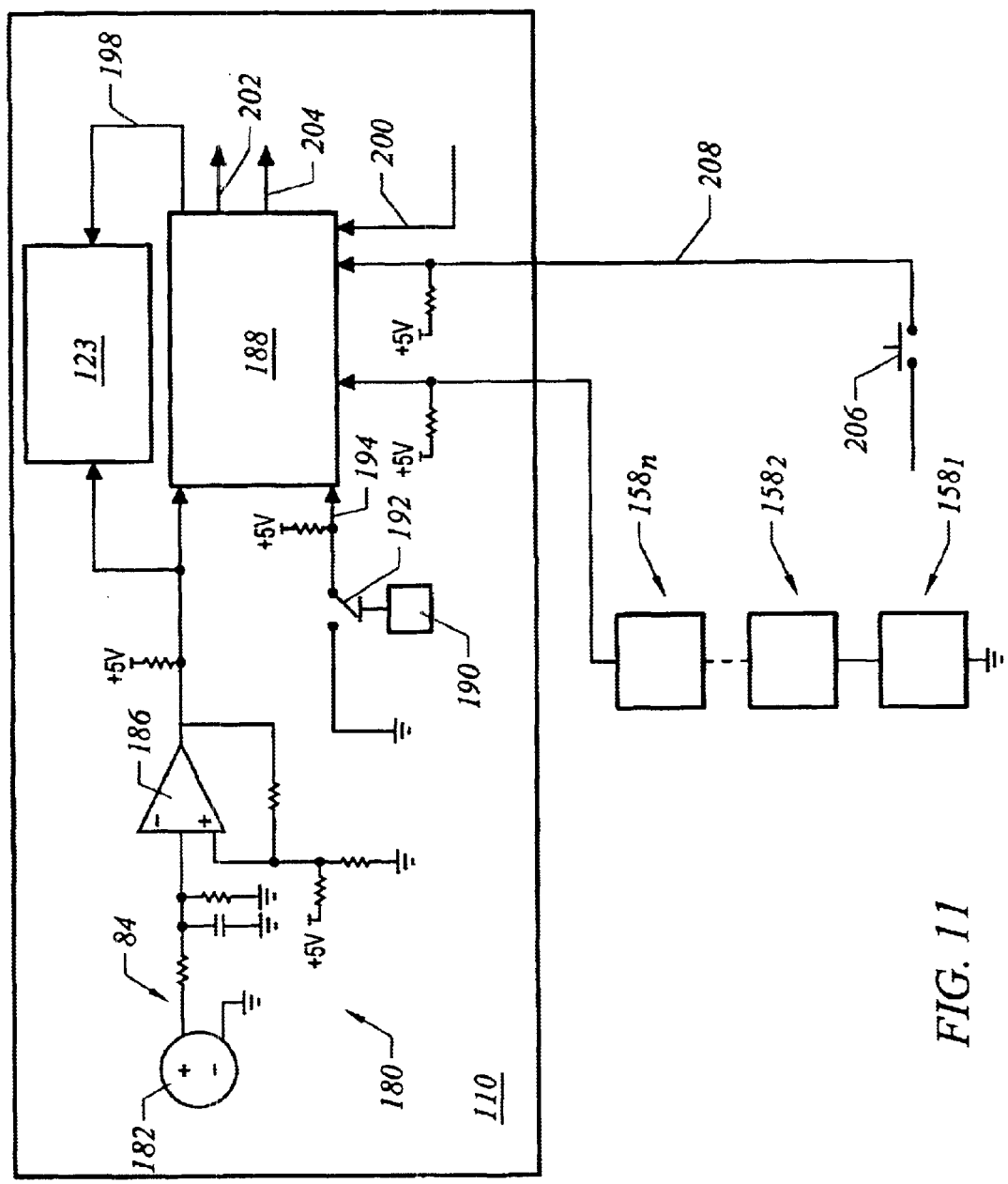
FIG. 11 is a block diagram of a circuit including the interlock circuit and a transport speed

Referring to FIG. 11, in addition to control by the host computer, the safeguarding system according to the present invention further includes a hardwired velocity circuit 180 mounted on and traveling with the transport assembly 110. The circuit 180 measures the velocity of the mast assembly independently of the host computer and can also identify when portions of the mast assembly are below 2135 mm. In particular, velocity circuit includes a tachometer 182 capable of generating a voltage directly proportional to the speed with which the vertical drive is advancing the mast assembly in the vertical direction. (Another tachometer may be provided for monitoring the speed of the mast assembly in the horizontal direction). The output of the tachometer is passed through a noise filter/attenuator 184 and is input to the negative terminal of a comparitor 186. The positive terminal of the comparitor receives a user defined threshold voltage, of for example 2.5 volts, although the threshold voltage maybe higher or lower than that in alternative embodiments.

The threshold voltage is selected such that, if the mast assembly is traveling above a predetermined maximum velocity for travel below 2135 mm, the output of the tachometer will be greater than the input threshold voltage. In this case, the output of the comparitor will go low (or logical 0). If the mast assembly is traveling below the predetermined maximum velocity, the output of the tachometer will be less than the input threshold voltage, and the output of the tachometer goes high (or logical 1). Thus the comparitor receives an analogue voltage and outputs a digital signal. The threshold voltage is also connected to the output of the comparitor to prevent output fluctuation as is known in the art.

The output of the comparitor 186 is input to an FPGA (field programmable gate array) 188 or the like which in a preferred embodiment has a latched output. The output of the comparitor 186 is also forwarded to the controller 123. The controller can compare the information received from velocity circuit 180 against the information received from the system host computer. If the system is working properly, both will indicate a speed of the mast assembly below the predetermined maximum or both will indicate a speed of the mast assembly above the predetermined maximum. In the event the host computer and velocity circuit have different readings, the host computer can then indicate the problem to an operator for investigation.

Separate and independent of the safe zone sensor 152 described above, the velocity circuit 180 further includes a gripper height sensor 190 mounted to the mast assembly for measuring when the gripper extends below 2135 mm. The sensor 190 may include a first portion mounted on the fixed mast 124 and a second portion on the mast slide 126. The first and second portions are positioned such that when the mast slide 126 passes below 2135 mm, the first and second portions cause the sensor 190 to change states. The output of the sensor 190 controls a switch 192 such that when the mast is traveling above 2135, the switch is closed and the $^+5V$ source is pulled to ground, thus setting the input over line 194 to logical 0. On the other hand, when portions of the mast assembly are traveling below 2135 mm, the switch is open and the pull up resistor sets the input over line 194 to the FPGA to logical 1.

Within FPGA 188, the input from the comparitor 186 is inverted and then ANDed together with the input from line 194. Thus, if the mast assembly is traveling at a high speed (logical 1) and the mast is below 2135 mm (logical 1), the output on line 198 from FPGA 188 to transport assembly controller 123 indicates that power should be cut to the transport assembly. Additionally, a latch within FPGA is set to 1, which latch needs to be reset before power can again be supplied to the transport assembly as explained hereinafter.

As is further shown on FIG. 12, the inputs from the various interlock circuits 158 are also input to the FPGA 188. If the mast assembly is below 2135, and either an operator is present at the tool or there is a problem at the load port, the interlock circuit will be open, and the pull up resistor sets the input to the FPGA to logical 1. In this event, the power to the transport assembly is cut off and the FPGA latch is set to 1.

In the event power to the transport system is cut as a result of the transport assembly being in the area of a tool and an operator subsequently entering that area, the power may automatically be restored to the transport assembly upon the operator leaving the tool. This may be accomplished by an instruction from the host computer over a line 200 to FPGA 188 to reset the latch. After the transport assembly shuts down, the transport assembly remains stationary until the light curtain 150 senses that the operator has left the tool 102. At that point, interlock circuit again registers no conflict and power is returned to the transport assembly. Upon return of power to the transport assembly, the system host computer can initiate a countdown sequence during which the transport assembly remains stationary. This countdown sequence ensures that the operator has left the area entirely before initiating normal operation of the transport assembly.

It may also be that the operator has left the tool only momentarily, in which case the transport system should not remain stationary. Thus, unless the predetermined countdown sequence passes without the light curtain 150 sensing an operator at the tool 102, the system host computer will not start the transport assembly. If no operator is detected at the tool 102 during the countdown sequence, the system host computer can again initiate movement of the transport assembly. It is also contemplated that an audible or visible alarm be given during the countdown sequence to indicate that the transport assembly is about to resume motion.

After shut down upon a detected conflict at a tool 102, the system host computer also checks and, if necessary corrects, the position of the mast assembly upon return of power to the transport assembly and passage of the countdown sequence. It may happen that the transport assembly was moved while shut down. Therefore, upon shut down, the actual position and target position of the transport assembly is stored in the control computer. As indicated above, encoders are provided for detecting the horizontal and vertical position of the mast assembly. Upon shut down of power to the transport assembly, power is maintained in the encoders through a separate or backup power supply. Thus, upon return of power to the transport assembly, the encoders are able to identify the actual position of the transport assembly. To the extent the actual position of the transport assembly after power return is different than the actual position of the transport assembly prior to power shut down, the control computer corrects the position of the transport assembly and normal operation of the transport assembly resumes.

As indicated above, the system may automatically restart after a situation where an operator enters an area occupied by the transport system. However, if the system shuts down as a result of the mast assembly entering into an area already occupied by an operator, or if the system shuts down as a result of velocity circuit 180, this is an indication that there is a problem in the system. In such an event, the host computer preferably does not automatically restart the system. In such an event, an alarm may issue over FPGA output 202 (if the problem is with a failure to high speed below 2135 mm) or over FPGA output 204 (if the problem is with a failure to detect a conflict at the tool). Once the problem has been fixed, the system may be restarted by a manual restart button 206 over line 208 to the FPGA which resets the FPGA. In an alternative embodiment, it may be required that the transport system always be manually restarted. In this embodiment, the automatic restart of the transport system 110 via line 200 may be omitted and all restart accomplished via restart button 206.

As would be appreciated by those of skill in the art, the described velocity circuit and FPGA are merely exemplary, and a great many other hardwired circuit configurations are contemplated for shutting down operation of the transport assembly 110 upon a detected high speed move below 2135 mm.

Figure 9:
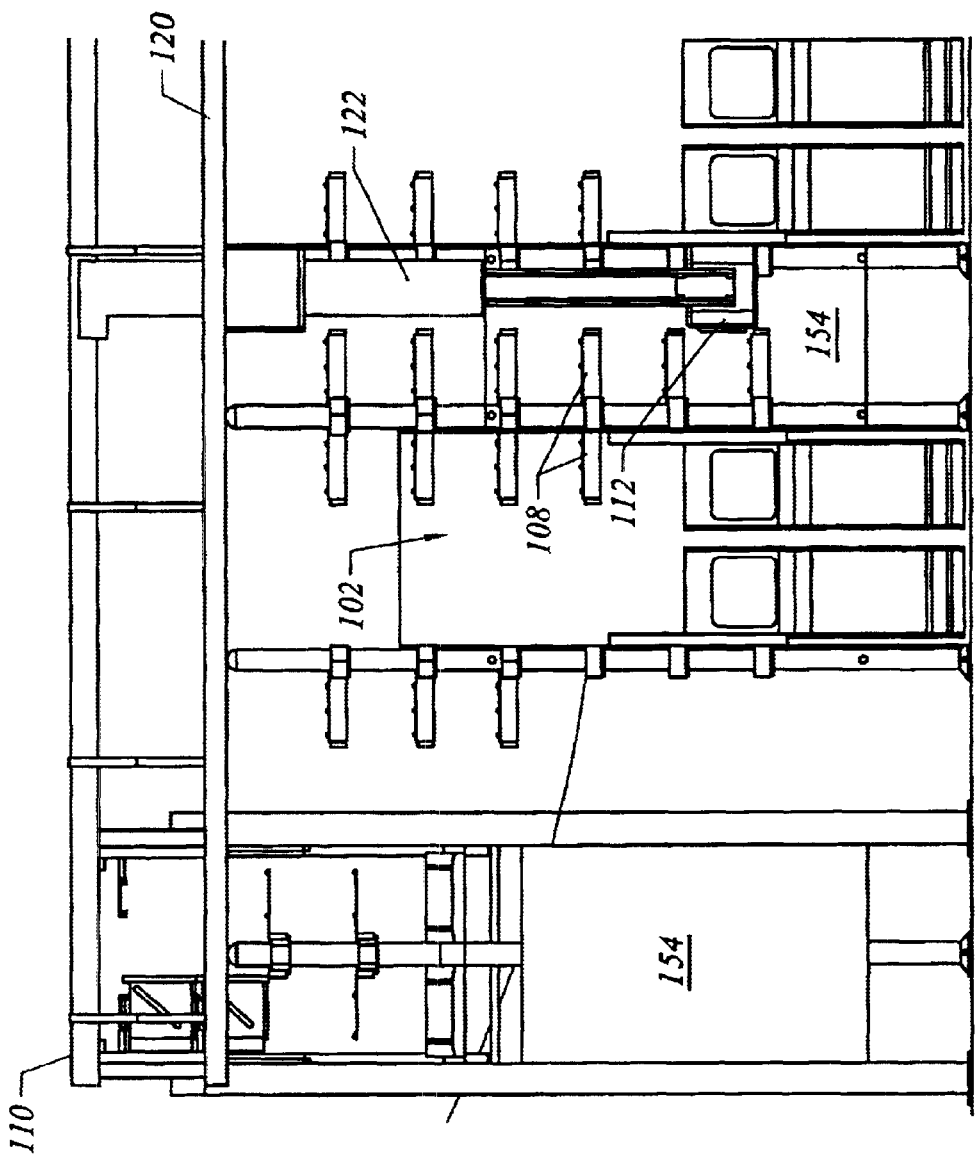
FIG. 9 is a front view illustrating a portion of a tool bay including safety shields according to the safeguarding system of the present invention.

As seen for example in FIGS. 1 and 9, the safeguard system according to the present invention further includes safety shields 154 for physically closing off the areas between tools which include nests 108 in the human/ automation common areas. Safety shields 154 may be clear plastic panels spaced away from the front of the tools, preferably in the same plane as the various light curtains 150, so that the safety shields do not interfere with the mast assembly 122 accessing nests 108 behind the shield. Safety shields 154 preferably extend down to or near the floor and extend up to a height of approximately 2135 mm. It is understood, however, that the safety shield 154 may extend higher or lower than that in alternative embodiments with the provision that the safety shield prevent an operator from inadvertently or advertently accessing an area between tools which is also accessed by the mast assembly 122.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A safeguarding system for a tool bay of a semiconductor wafer fab, the safeguarding system capable of preventing potential conflict at a tool between an assembly for transporting pods and an operator at the tool, the system comprising:
   a first sensor for sensing the presence of the operator proximate to the tool;
   a second sensor for sensing the presence of the pod transport assembly proximate to the tool; and
   a control system for 1) preventing the pod transport assembly from accessing the tool in the event said first sensor senses the operator proximate to the tool; or 2) stopping the pod transport assembly in the event said first sensor senses the operator proximate to the tool and said second sensor senses the pod transport assembly proximate to the tool.

2. A safeguarding system for a tool bay of a semiconductor wafer fab as recited in claim 1, wherein said first sensor comprises a light curtain including a plurality of break-the-beam sensors mounted to a front portion of the tool.

3. A safeguarding system for a tool bay of a semiconductor wafer fab as recited in claim 1, wherein said second sensor comprises a break-the-beam sensor mounted above the tool.

4. A safeguarding system for a tool bay of a semiconductor wafer fab, the tool bay including a pod transport assembly for transporting pods at a first speed when positioned above a reference height and for transporting pods at a second speed when positioned below the reference height, the second speed being slower than the first speed, the safeguarding system capable of preventing the pod transport system from moving at the first speed below the reference height, the system comprising:
   a first sensor for sensing the speed of a moving portion of the transport assembly;
   a second sensor for sensing the height of said moving portion of the transport assembly; and
   a control system for stopping the pod transport assembly in the event said first sensor senses said moving portion moving above said second speed and said second sensor senses a height of said moving portion below the reference height.

* * * * *